(12) United States Patent
Hsiao

(10) Patent No.: US 7,829,961 B2
(45) Date of Patent: Nov. 9, 2010

(54) MEMS MICROPHONE PACKAGE AND METHOD THEREOF

(75) Inventor: Wei-Min Hsiao, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 167 days.

(21) Appl. No.: 11/943,599

(22) Filed: Nov. 21, 2007

(65) Prior Publication Data

US 2008/0164545 A1 Jul. 10, 2008

(30) Foreign Application Priority Data

Jan. 10, 2007 (TW) .............................. 96101007 A

(51) Int. Cl.
*H01L 29/78* (2006.01)
(52) U.S. Cl. ............... 257/416; 257/687; 257/E23.116; 438/127
(58) Field of Classification Search ........... 257/416, 257/687, E23.116; 438/127
See application file for complete search history.

(56) References Cited

U.S. PATENT DOCUMENTS

2007/0205492 A1* 9/2007 Wang ....................... 257/659
2007/0222008 A1* 9/2007 Chen et al. ................. 257/415

* cited by examiner

*Primary Examiner*—Bradley K Smith
*Assistant Examiner*—Jami M Valentine
(74) *Attorney, Agent, or Firm*—Winston Hsu; Scott Margo

(57) ABSTRACT

A MEMS microphone package includes a carrier, an application specific IC, an encapsulant and a microphone chip. The application specific IC and the microphone chip are respectively disposed on first and second surfaces of the carrier, and the application specific IC and the microphone chip are electrically connected to the carrier. The encapsulant includes first and second encapsulants, the first encapsulant is formed on the first surface to seal the application specific IC, the second encapsulant is formed on the second surface to become a cavity and the microphone chip is located at the cavity. Because the application specific IC and the microphone chip are disposed on the first and second surfaces of the carrier, respectively, the second encapsulant surrounds the microphone chip, and the first and second encapsulants are formed at the same time, it can increase the structural strength of package and reduce the process.

10 Claims, 7 Drawing Sheets

MEMS MICROPHONE PACKAGE AND METHOD THEREOF

BACKGROUND OF THE INVENTION

1. Field of the Invention

The present invention relates to a MEMS microphone package structure. More particularly, the present invention relates to a MEMS microphone package structure which has a smaller package size and increased structural strength.

2. Description of the Prior Art

As shown in FIG. 1, the conventional micro-chip-microphone 10 includes a base 11, a back chip 12, a diaphragm chip 13 and a field effect transistor 14. The back chip 12 is disposed on and electrically connected to the base 11. The back chip 12 has a back electrode 12a and a plurality of through-holes 12b. The diaphragm chip 13 has an electrode layer 13a, a diaphragm 13b and a separator 13c. The diaphragm chip 13 is attached to the back chip 12 by means of separator 13c and electrically connected to the field effect transistor 14. The field effect transistor 14 is disposed on and electrically connected to the base 11. When sound energy applies on the electrode layer 13a of the diaphragm chip 13, the diaphragm 13b deforms and affects the electric capacity of the electrode layer 13a, the diaphragm 13b and back electrode 12a so that the field effect transistor 14 may transfer the changed electric capacity as electric signals. As shown in FIG. 1, the back electrode 12a of the back chip 12, the diaphragm 13b of the diaphragm chip 13 and the field effect transistor 14 must be electrically connected if the electric signals need transferring. The back electrode 12a, the diaphragm 13b, electrode layer 13a and the field effect transistor 14 have to be electrically connected through the base 11, which causes uncertainty of fabrication and the size of the base 11 larger than the combination of the back chip 12, the diaphragm chip 13 and the field effect transistor 14 to protect the back chip 12, the diaphragm chip 13 and the field effect transistor 14. Those all make the size of the micro-chip-microphone 10 not able to be further reduced.

SUMMARY OF THE INVENTION

One aspect of the present invention provides a MEMS microphone package and the method thereof, including a carrier with a first surface and a second surface, an application specific IC disposed on the first surface of the carrier and electrically connected to the carrier, a first encapsulant formed on the first surface to seal the application specific IC, a second encapsulant formed on the second surface to form a cavity together with the carrier, and a microphone chip disposed on the second surface of the carrier, in the cavity and electrically connected to the carrier. The first encapsulant and the second encapsulant are formed in unity, and the second encapsulant surrounds the microphone chip, so the structural strength of package can be increased and the process can be reduced.

The MEMS microphone package structure according to the present invention mainly includes a carrier, an application specific IC, an encapsulant and a microphone chip; the carrier with a first surface and a second surface, the application specific IC disposed on a first surface and electrically connected to the carrier; the encapsulant including a first encapsulant and a second encapsulant, the first encapsulant formed on the first surface to seal the application specific IC, the second encapsulant formed on the second surface to form a cavity with the carrier and the microphone chip disposed on the second surface, in the cavity and electrically connected to the carrier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
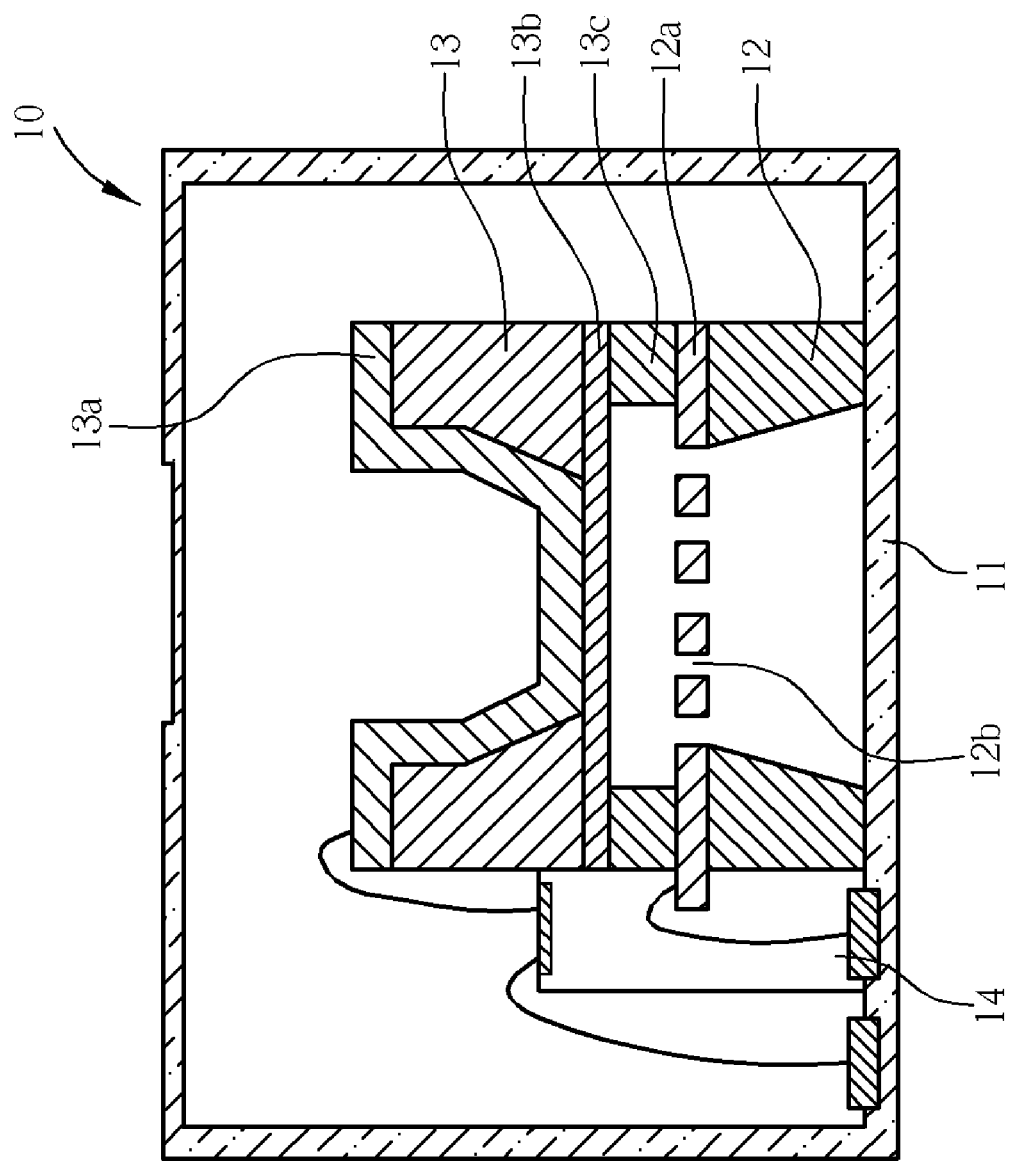
FIG. 1 illustrates a cross section of a conventional microchip microphone.
Figure 2:
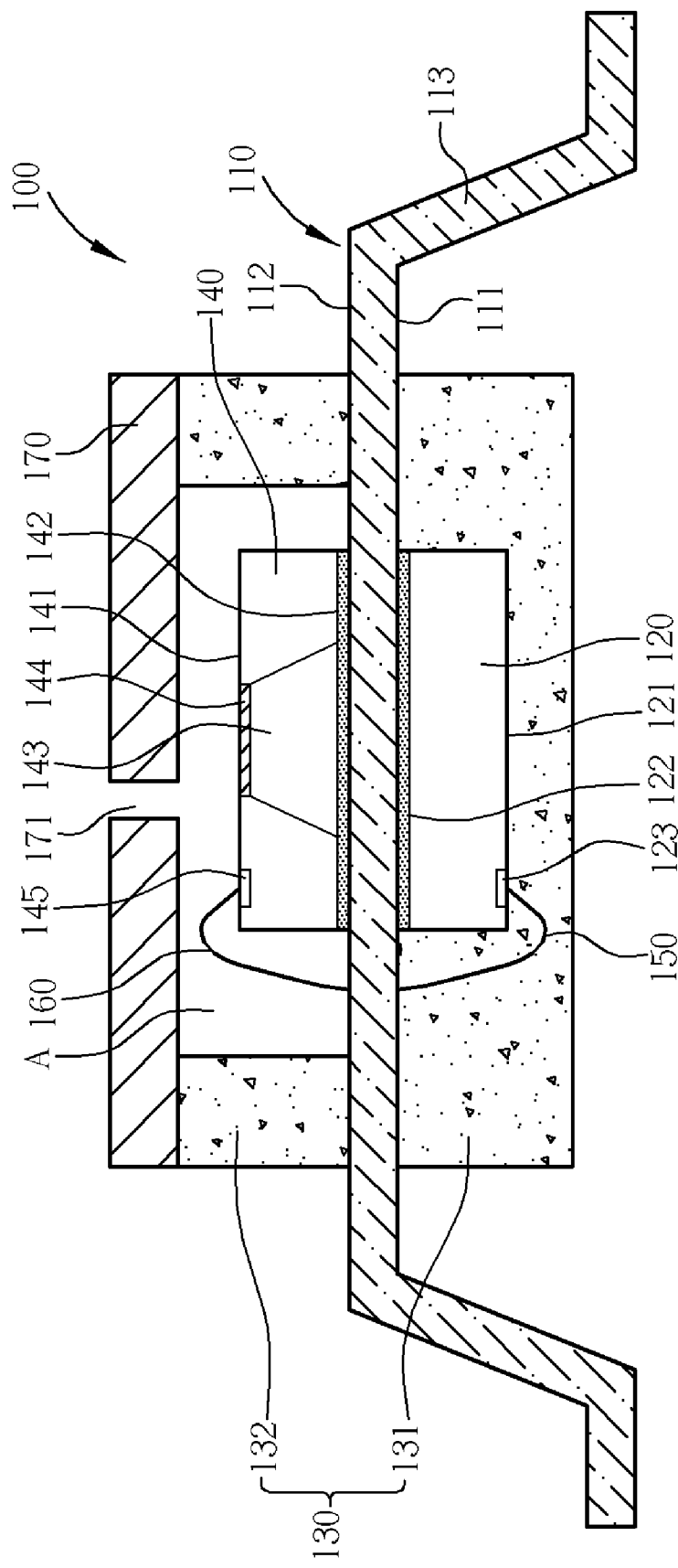
FIG. 2 illustrates a first embodiment of a cross section of a MEMS microphone package structure of the present invention.
Figure 3A:
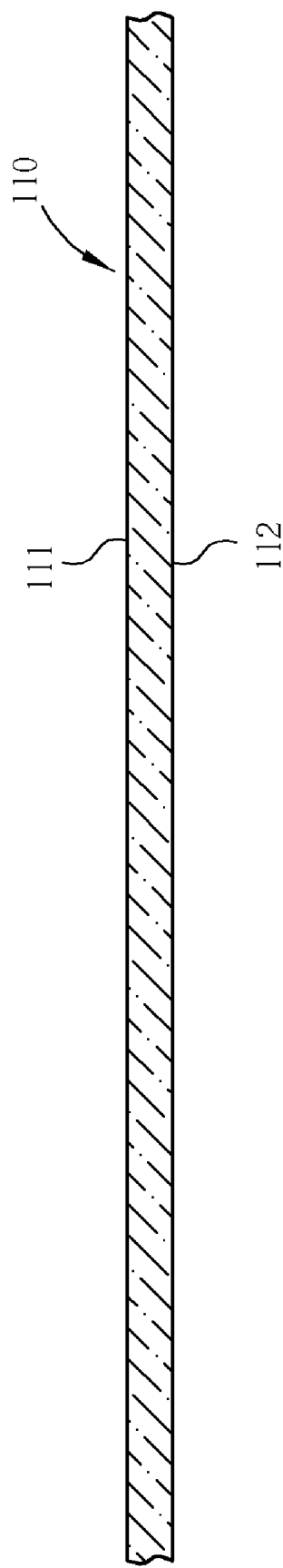
FIGS. 3A to 3D illustrate a first embodiment of a cross section of the method of the MEMS microphone packaging of the present invention.
Figure 3B:
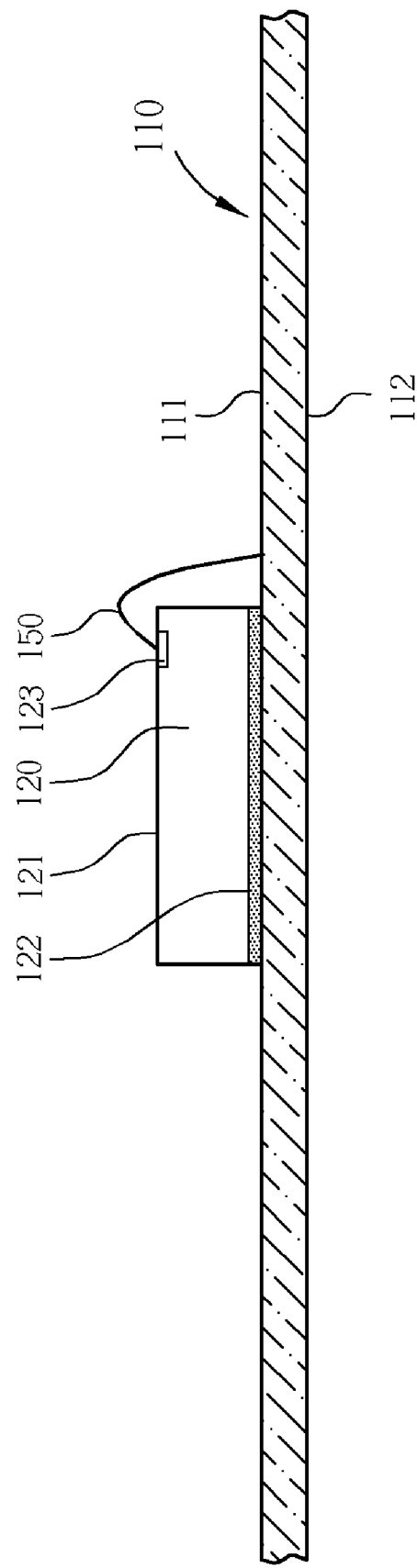
Figure 3C:
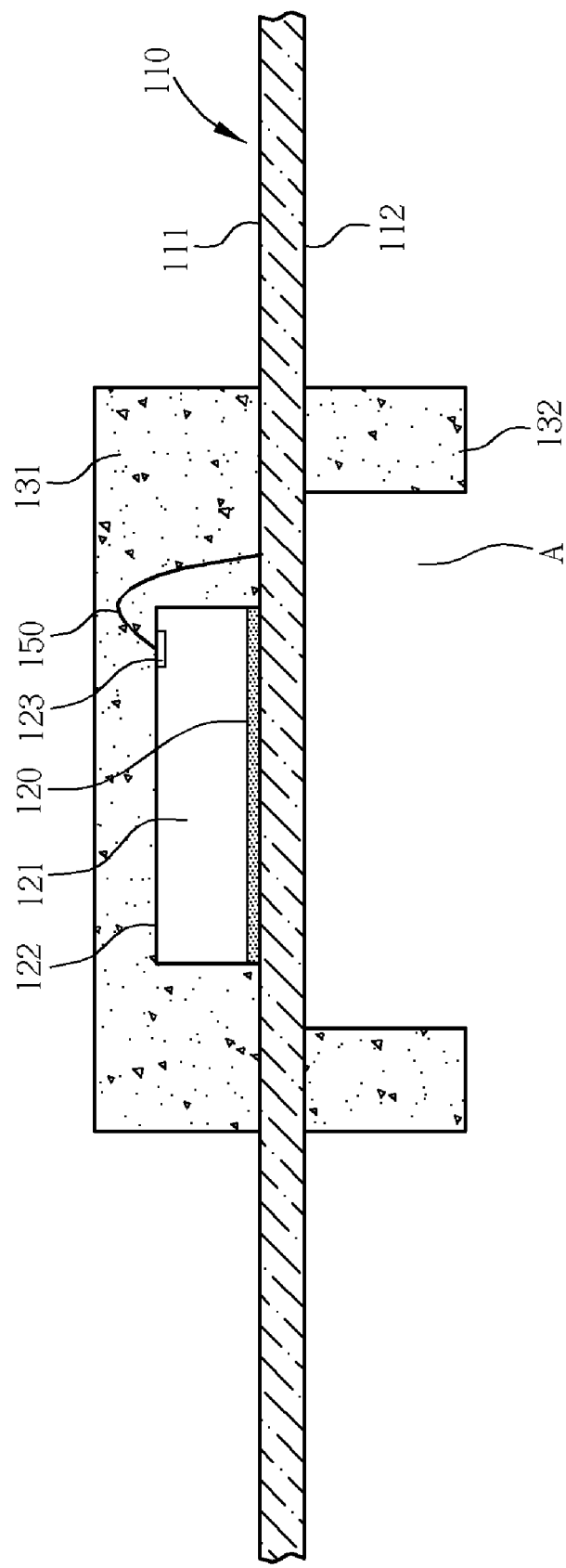
Figure 3D:
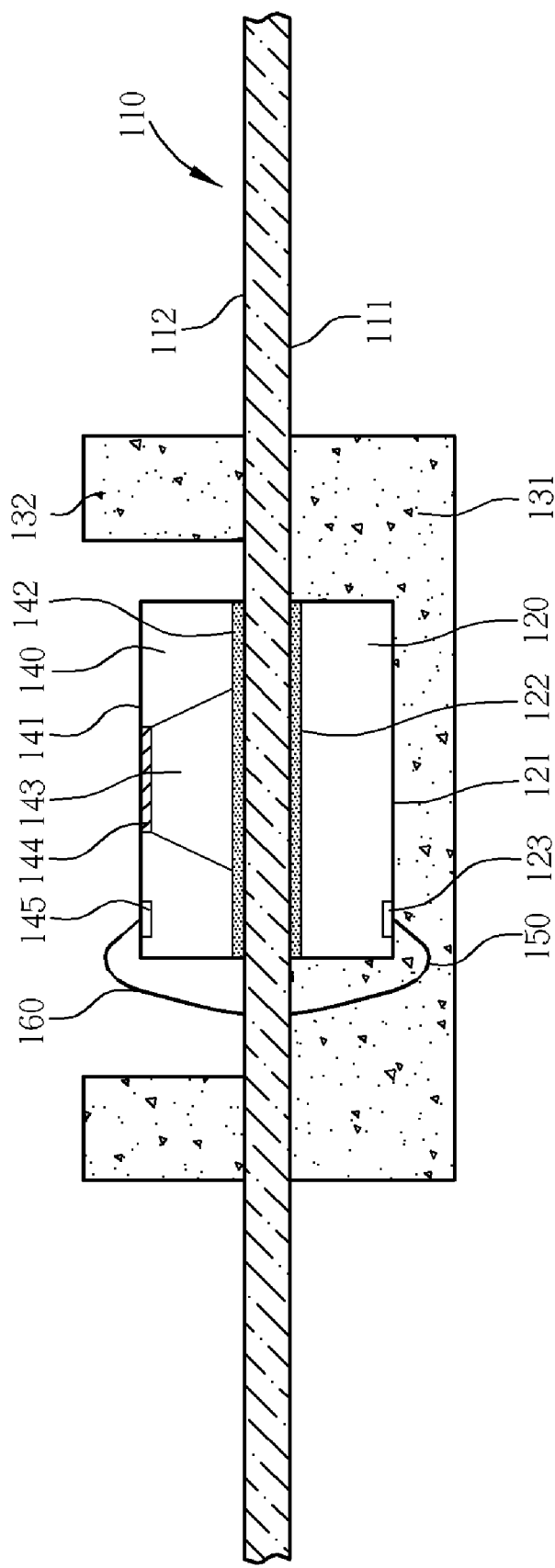

Please refer to FIG. 2, illustrating a first embodiment of the present invention and disclosing a MEMS microphone package structure 100. The MEMS microphone package structure 100 includes a carrier 110, an application specific IC 120, an encapsulant 130 and a microphone chip 140. The carrier 110 has a first surface 111 and a second surface 112, and may be a substrate or a leadframe. In the present embodiment, the carrier 110 is a leadframe. The application specific IC 120 is disposed on the first surface 111 of the carrier 110 and electrically connected to the carrier 110. The application specific IC 120 has an active surface 121, a back 122 and at least a solder pad 123. The back 122 of the application specific IC 120 is attached to the first surface 111 of the carrier 110. The solder pad 123 of the application specific IC 120 is formed on the active surface 121 of the application specific IC 120. The MEMS microphone package structure 100 further includes at least a first conductive element 150 for electrically connecting the carrier 110 and the solder pad 123 of the application specific IC 120. The first conductive element 150 may be a bump or a wire. In the present embodiment, the first conductive element 150 is a wire. The encapsulant 130 includes a first encapsulant 131 and a second encapsulant 132. The first encapsulant 131 is formed on the first surface 111 of the carrier 110 to seal the application specific IC 120 and the second encapsulant 132 is formed on the second surface 112. In the present embodiment, the second encapsulant 132 is in a shape of a ring, such as "☐" or "0". The second encapsulant 132 forms a cavity "A" together with the carrier 110. The microphone chip 140 is disposed on the second surface 112 of the carrier 110 in the cavity "A" and electrically connected to the carrier 110. The second encapsulant 132 of the encapsulant 130 surrounds the microphone chip 140. The microphone chip 140 has an active surface 141, a back 142 and a resonant cavity 143, a diaphragm 144 and at least one solder pad 145. The soldier pad 145 and the diaphragm 144 are formed on the active surface 141. The back 142 of the microphone chip 140 is attached to the second surface 112 of the carrier 110. The MEMS microphone package structure 100 further includes at least a second conductive element 160. The second conductive element 160 connects the soldier pad 145 of the microphone chip 140 and the carrier 110 and may be a bump or a wire. A plurality of exterior leads 113 of the carrier 110 is exposed over the first encapsulant 131 and the second encapsulant 132. The first encapsulant 131 and the second encapsulant 132 may be transfer molding compound, liquid molding compound or underfills. Preferably, the first encapsulant 131 and the second encapsulant 132 are formed integrally. Besides, the MEMS microphone package structure 100 further includes a cover 170. The cover 170 is disposed on the second encapsulant 132 of the encapsulant 130, to encapsulate and protect the microphone chip 140 and the second conductive element 160. The intersection of the cover 170 may be in an "I" or "U" shape. The cover 170 may have at least a hole 171 to conduct the sound waves. Because the application specific IC 120 and the microphone chip 140 are respectively disposed on the first surface 111 and the second surface 112 of the carrier 110, the size of the package is therefore smaller. In addition, because the first encapsulant 131 and the second encapsulant 132 of the encapsulant 130 are respectively formed on the first surface 111 and the second surface 112 of the carrier 110, to seal the application specific IC 120 and to surround the microphone chip 140, and the first encapsulant 131 and the second encapsulant 132 are formed integrally, the structural strength of the package is increased and the process is simplified.

Please refer to FIGS. 3A to 3D, illustrating the method of the MEMS microphone packaging of the first embodiment. First, please refer to FIG. 3A. A carrier 110 is provided. The carrier 110 has a first surface 111 and a second surface 112. In this embodiment, the carrier 110 is a leadframe. Please refer to FIG. 3B. An application specific IC 120 is disposed on the first surface 111 of the carrier 110. One back 122 of the application specific IC 120 is attached to the first surface 111 of the carrier 110 and form at least one first conductive element 150 to connect the carrier 110 and the solder pad 123 of the application specific IC 120. In this embodiment, the first conductive element 150 is a wire. Afterwards, please refer to FIG. 3C, a first encapsulant 131 is formed on the first surface 111 of the carrier 110 to seal the application specific IC 120, and a second encapsulant 132 is formed the second surface 112 of the carrier 110 to form a cavity A together with the carrier 110. In this embodiment, the second encapsulant 132 is in a shape of a ring, such as "□" or "0". The first encapsulant 131 and the second encapsulant 132 are formed integrally by a compression molding process or a dispensing process. Now, please refer to FIG. 3D, a microphone chip 140 is disposed in the cavity A. The second encapsulant 132 surrounds the microphone chip 140. The microphone chip 140 has an active surface 141, a back 142 and a resonant cavity 143, a diaphragm 144 and at least a solder pad 145. The diaphragm 144 and the solder pad 145 are formed on the active surface 141. The back 142 is attached to the second surface 112 of the carrier 110. In this step, a second conductive element 160 is connected to the solder pad 145 of the microphone chip 140 and the carrier 110. At last, as shown in FIG. 2, a cover 170 is disposed on the second encapsulant 132. The intersection of the cover 170 may be in an "I" or "U" shape to protect the microphone chip 140 and the second conductive element 160. The cover 170 may have at least a hole 171 to conduct the sound waves.

Figure 4:
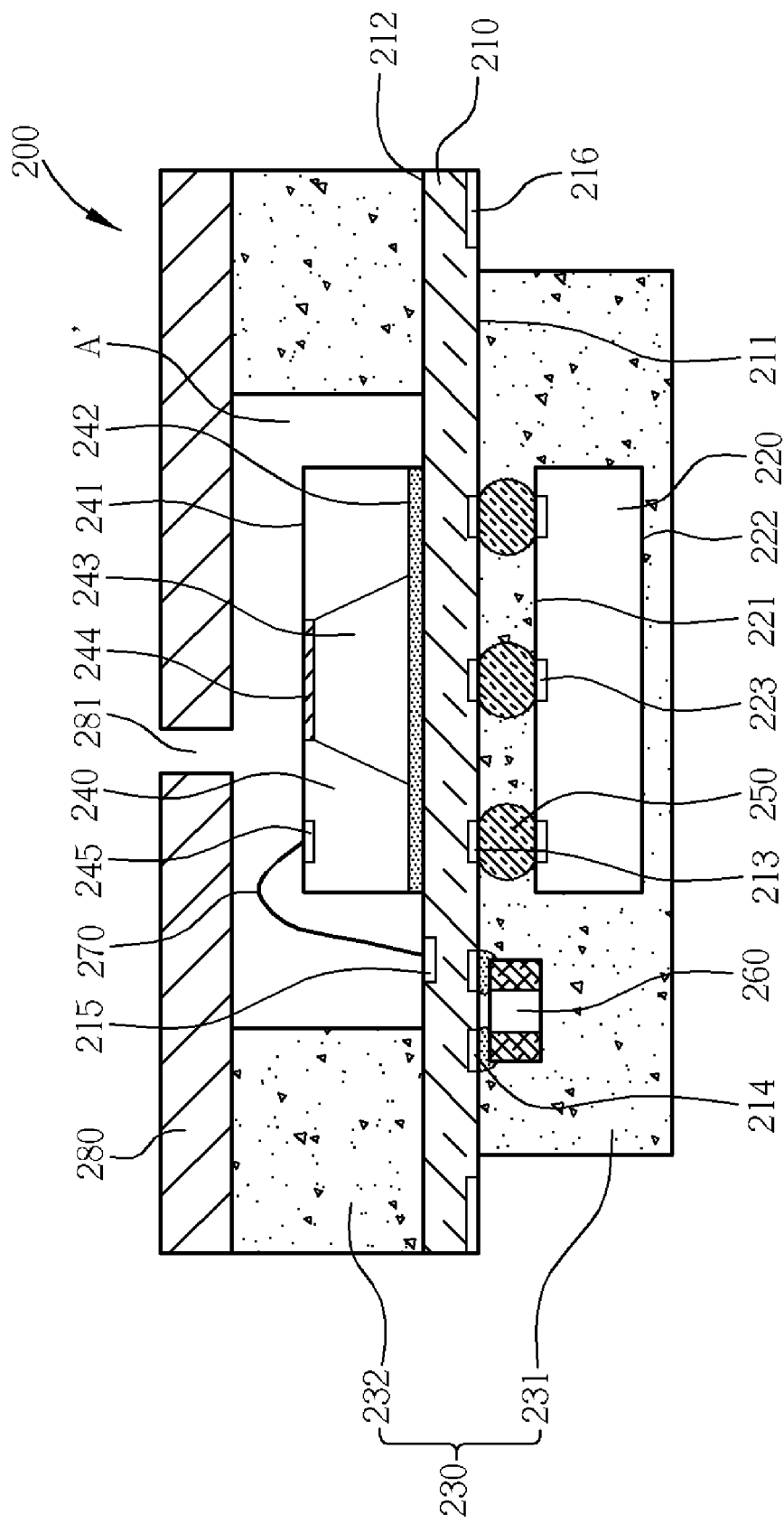
FIG. 4 illustrates another embodiment of a cross section of the method of the MEMS microphone packaging of the present invention.

FIG. 4 illustrates a second embodiment of the present invention. Another MEMS microphone package structure 200 includes a carrier 210, an application specific IC 220, an encapsulant 230 and a microphone chip 240. In this embodiment, the carrier 210 is a substrate. The carrier 210 has a first surface 211 and a second surface 212. A plurality of first connecting pads 213 and a plurality of second connecting pads 214 are formed on first surface 211. At least one third connecting pad 215 is formed on the second surface 212. The application specific IC 220 is disposed on the first surface 211 of the carrier 210 and electrically connected to the 210. The application specific IC 220 has an active surface 221, a back 222 and a plurality of solder pads 223. The active surface 221 of the application specific IC 220 faces the first surface 211 of the carrier 210. The MEMS microphone package structure 200 further includes a plurality of first conductive elements 250. In this embodiment, the first conductive elements 250 are bumps. The first conductive elements 250 connect the first connecting pads 213 of the carrier 210 and the solder pads 223 of the application specific IC 220. Preferably, the MEMS microphone package structure 200 further includes a passive element 260 disposed on the first surface 211 of the carrier 210. The passive element 260 is located on the second connecting pads 214 of the carrier 210 by the assist of soldering materials. The encapsulant 230 includes a first encapsulant 231 and a second encapsulant 232. The first encapsulant 131 is formed on the first surface 211 of the carrier 210 to seal the application specific IC 220 and the passive element 260. The second encapsulant 232 is formed the second surface 212 of the carrier 210. The second encapsulant 232 is in a shape of a ring, such as "□" or "0". The second encapsulant 232 and the carrier 210 together form a cavity A'. The microphone chip 240 is disposed on the second surface 212 of the carrier 210, in the cavity A' and electrically connected to the carrier 210. The microphone chip 240 has an active surface 241, a back 242 and a resonant cavity 243, a diaphragm 244 and at least a solder pad 245. The solder pad 245 and the diaphragm 244 are formed on the active surface 241. The back 242 of the microphone chip 240 is attached to the second surface 212 of the carrier 210. The second encapsulant 232 surrounds the microphone chip 240. Additionally, in another embodiment, the passive element 260 may be disposed on the second surface 212 of the carrier 210 and sealed by the second encapsulant 232. The MEMS microphone package structure 200 further includes at least a second conductive element 270. The second conductive element 270 connects the soldier pad 245 of the microphone chip 240 and the third connecting pads 215 of the carrier 210. The first encapsulant 231 and the second encapsulant 232 may be transfer molding compound, liquid molding compound or underfills. Preferably, the first encapsulant 231 and the second encapsulant 232 are formed integrally. Besides, the MEMS microphone package structure 200 further includes a cover 280 disposed on the second encapsulant 232 of the encapsulant 230 to protect the microphone chip 240 and the second conductive element 270. The intersection of the cover 280 may be in an "I" or "U" shape. The cover 280 may have at least a hole 281 to conduct the sound waves. The first surface 211 of the carrier 210 further includes a plurality of external pads 216 so that the MEMS microphone package structure 200 may be connected to an external element (not shown). The MEMS microphone package structure 200 may also increase the structural strength and reduce the process.

Those skilled in the art will readily observe that numerous modifications and alterations of the device and method may be made while retaining the teachings of the invention.

What is claimed is:

1. A MEMS microphone package, comprising:
   a carrier with a first surface and a second surface which is non-coplanar with and opposite to said first surface;
   an application specific IC disposed on said first surface of said carrier and electrically connected to said carrier;
   a first encapsulant formed on said first surface of said carrier to seal said application specific IC;

a second encapsulant formed on said second surface of said carrier to form a cavity together with said second surface of said carrier; and a microphone chip disposed on said second surface of said carrier, in said cavity and electrically connected to said carrier.

2. The MEMS microphone package of claim 1, further comprising at least a first conductive element for electrically connecting said carrier and said application specific IC and at least a second conductive element for electrically connecting said carrier and said microphone chip.

3. The MEMS microphone package of claim 2, wherein said first conductive element and said second conductive element are selected from a group consisting of a bump and a wire.

4. The MEMS microphone package of claim 1, wherein said first encapsulant and said second encapsulant are formed in unity.

5. The MEMS microphone package of claim 1, wherein said carrier is selected from a group consisting of a substrate and a leadframe.

6. The MEMS microphone package of claim 1, further comprising a passive element disposed on said carrier.

7. The MEMS microphone package of claim 6, wherein said passive element is disposed on said first surface of said carrier and encapsulated by said first encapsulant.

8. The MEMS microphone package of claim 6, wherein said passive element is disposed on said second surface of said carrier and encapsulated by said second encapsulant.

9. The MEMS microphone package of claim 1, wherein said first encapsulant and said second encapsulant is selected from a group consisting of transfer molding compound, liquid molding compound and underfill.

10. The MEMS microphone package of claim 1, further comprising a cover having at least one hole and disposed on said second encapsulant.

* * * * *